United States Patent
Dargis et al.

(10) Patent No.: US 8,878,188 B2
(45) Date of Patent: Nov. 4, 2014

(54) REO GATE DIELECTRIC FOR III-N DEVICE ON SI SUBSTRATE

(71) Applicants: Rytis Dargis, Fremont, CA (US); Robin Smith, Palo Alto, CA (US); Andrew Clark, Los Altos, CA (US); Erdem Arkun, San Carlos, CA (US); Michael Lebby, Apache Junction, AZ (US)

(72) Inventors: Rytis Dargis, Fremont, CA (US); Robin Smith, Palo Alto, CA (US); Andrew Clark, Los Altos, CA (US); Erdem Arkun, San Carlos, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 146 days.

(21) Appl. No.: 13/774,962

(22) Filed: Feb. 22, 2013

(65) Prior Publication Data

US 2014/0239307 A1 Aug. 28, 2014

(51) Int. Cl.
*H01L 29/51* (2006.01)
*H01L 29/20* (2006.01)
*H01L 21/02* (2006.01)

(52) U.S. Cl.
CPC ........ *H01L 29/517* (2013.01); *H01L 21/02192* (2013.01); *H01L 21/02381* (2013.01); *H01L 21/0254* (2013.01)
USPC ............. 257/76; 257/190; 257/192; 257/615; 438/478; 438/591

(58) Field of Classification Search
CPC ................... H01L 21/02192; H01L 21/02381; H01L 21/02458; H01L 21/0254; H01L 21/02598; H01L 21/28264; H01L 29/66075; H01L 29/66446; H01L 21/66462; H01L 29/517
USPC ......... 257/12, 20, 24, 76, 190, 191, 192, 194, 257/195, 201, 615; 438/478, 590, 591
See application file for complete search history.

(56) References Cited

U.S. PATENT DOCUMENTS

| | | | |
|---|---|---|---|
| 8,633,569 B1 * | 1/2014 | Arkun et al. | 257/615 |
| 8,680,507 B1 * | 3/2014 | Arkun et al. | 257/13 |

* cited by examiner

*Primary Examiner* — Matthew W Such
*Assistant Examiner* — Scott Stowe
(74) *Attorney, Agent, or Firm* — Parsons & Goltry; Robert A. Parsons; Michael W. Goltry

(57) ABSTRACT

A rare earth oxide gate dielectric on III-N material grown on a silicon substrate includes a single crystal stress compensating template positioned on a silicon substrate. The stress compensating template is substantially crystal lattice matched to the surface of the silicon substrate. A GaN structure is positioned on the surface of the stress compensating template and substantially crystal lattice matched thereto. An active layer of single crystal III-N material is grown on the GaN structure and substantially crystal lattice matched thereto. A single crystal rare earth oxide dielectric layer is grown on the active layer of III-N material.

21 Claims, 3 Drawing Sheets

REO GATE DIELECTRIC FOR III-N DEVICE ON SI SUBSTRATE

FIELD OF THE INVENTION

This invention relates in general to the growth of a III-N device with matching gate dielectric on a silicon substrate and more specifically to the incorporation of a REO gate dielectric layer for a III-N device.

BACKGROUND OF THE INVENTION

It is known that III-N based devices, such as GaN semiconductor devices, grown on a silicon substrate require gate dielectric material with sufficient dielectric constant and a proper band offset for good operating characteristics, e.g. low leakage currents and good gate control. In the prior art some attempts at using high-k polycrystalline materials have been unsuccessful. For example, polycrystalline $Hf_2O_3$ has been proposed for a gate dielectric. However, the material was found to be unsuitable because of leakage current paths via nanocrystallite grain boundaries and because crystal defects induce high interface state density which deteriorate electrical properties of the material.

In the semiconductor industry, it is also known that growing a III-N material, such as GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. Generally, the prior art buffer layers are either, complicated and expensive to form or do not adequately reduce the strain in the GaN due to crystal lattice mismatch.

It would be highly advantageous, therefore, to remedy the foregoing and other deficiencies inherent in the prior art.

Accordingly, it is an object of the present invention to provide new and improved gate dielectrics for III-N devices on silicon substrates.

It is another object of the present invention to provide new and improved methods for the growth of gate dielectrics in III-N devices on silicon substrates.

It is another object of the present invention to provide new and improved methods for the growth of III-N devices on a silicon substrate that includes substantially reducing strain in the final III-N material.

It is another object of the present invention to provide new and improved gate dielectrics with sufficient dielectric constants and proper band offsets for III-N devices.

SUMMARY OF THE INVENTION

Briefly, the desired objects and aspects of the instant invention are realized in accordance with a rare earth oxide gate dielectric on III-N material grown on a silicon substrate. The structure includes a single crystal stress compensating template positioned on a silicon substrate. The stress compensating template is substantially crystal lattice matched to the surface of the silicon substrate. A GaN structure is positioned on the surface of the stress compensating template and substantially crystal lattice matched thereto. An active layer of single crystal III-N material is grown on the GaN structure and substantially crystal lattice matched thereto. A single crystal rare earth oxide dielectric layer is grown on the active layer of III-N material.

The desired objects and aspects of the instant invention are further achieved in accordance with a preferred method of growing rare earth oxide gate dielectric on III-N material grown on a silicon substrate. The method includes the steps of providing a single crystal silicon substrate and growing or depositing a single crystal stress compensating template on the silicon substrate. The stress compensating template is substantially crystal lattice matched to the surface of the silicon substrate. The method further includes the step of growing or depositing a single crystal GaN structure on the surface of the stress compensating template. The GaN structure is substantially crystal lattice matched to the single crystal stress compensating template. An active layer of single crystal III-N material is grown or deposited on the GaN structure, with the single crystal III-N material substantially crystal lattice matched to the GaN structure, and a single crystal rare earth oxide dielectric layer is grown or deposited on the active layer of III-N material.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
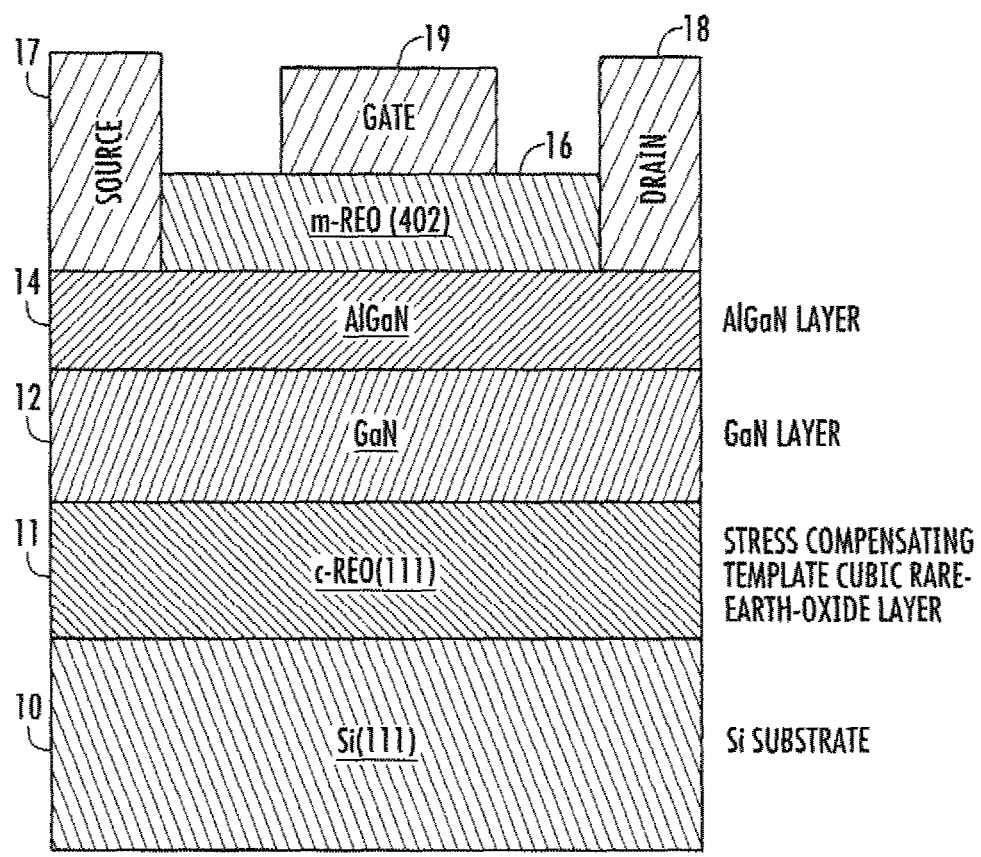
FIG. 1 is a simplified layer diagram illustrating a REO gate dielectric on a III-N device with a stress compensating REO template, in accordance with the present invention.

Turning to FIG. 1, a simplified layer diagram is illustrated representing several steps in a process of growing a REO gate dielectric on a III-N device with a stress compensating REO template, in accordance with the present invention. It will be understood that silicon substrate 10 is or may be a standard well known single crystal wafer or portion thereof generally known and used in the semiconductor industry. Single crystal substrates, it will be understood, are not limited to any specific crystal orientation but could include (111) silicon, (110) silicon, (100) silicon or any other orientation or variation known and used in the art. The Si (100) and (111) substrates could also include various miscuts with nominal value between 0 and 10° in any direction. However, throughout this disclosure substrate 10 is illustrated with a preferred (111) orientation because of the simplification of further operations.

A stress compensating template 11 including rare earth oxide (REO) is epitaxially grown on silicon substrate 10. Various rare earth oxides have a crystal lattice spacing that can be matched to silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. Further, the crystal lattice spacing of REO template 11 can be varied by varying the composition of the constituents, which allows for strain engineering of the silicon wafers. Generally, the REO material closest to or adjacent silicon substrate 10 will have a crystal spacing closest to the crystal spacing of silicon while REO materials adjacent the opposite (upper) side of REO template 11 will have a crystal spacing closer to the crystal spacing of materials grown on the surface. Also, at least the portion of REO template 11, adjacent silicon substrate 10 has a cubic crystal formation to match the crystal formation of silicon substrate 10. Basically, REO template 11 is a stress compensating template including one or more sub-layers (stepped or graded) of rare earth oxide defining, in conjunction with substrate 10 a "substrate structure". Strain engineering mitigates the stresses formed during growth of III-N materials and devices on these substrate structures.

In a typical example, REO template 11 includes $Gd_2O_3$ epitaxially grown on silicon substrate 10 with $Er_2O_3$ epitaxially grown adjacent the opposite (upper) side. Also, some REO materials have a hexagonal crystal structure, rather than a cubic crystal structure, and REO template 11 can include some of these materials to gradually convert the template from cubic to hexagonal. In any case the REO materials can be grown in a graded fashion bridging the two compositions or split to have an abrupt change in the composition and/or constituents of template 11. Also, while two constituents are used in this example other and/or additional rare earth oxides can be included in template 11.

It should be noted that rare earth oxide is impervious to MBE process gasses, i.e. $N_2$ plasma, $NH_3$ and metallic Ga, which is the preferred growth process in this invention. Also, in the event that other growth processes are used, such as the MOCVD process, the rare earth oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursor). Thus silicon substrate 10 is protected from damage caused by generally all growth process gasses by REO template 11. Also, REO template 11 can be formed with a single continuous composition or it can be graded, in linear, stepwise or any similar schemes.

A gallium nitride (GaN) layer 12 is epitaxially grown on REO template 11 preferably by an MBE process. Generally, GaN layer 12 will be in a range of 50 nm to 100 nm thick, although thicker (as much as a micrometer) or thinner layers can be grown in some applications. Because there will still be some strain in GaN layer 12, i.e. the crystal lattice junction with REO template 11 still produces some strain, a thinner layer 12 of GaN is preferred. Also, any of the structures outlined below for further reducing stress can be included if desired.

Since there may still be some strain in GaN layer 12, it may in some applications be desirable to incorporate additional structure to further reduce that strain. As explained in a copending United States patent application entitled "AlN Inter-Layers in III-N Material Grown on REO/Silicon Substrate", Ser. No. 13/742,590, filed on 16 Jan. 2013, and incorporated herein by reference, a thin inter-layer of aluminum nitride (AlN) is epitaxially grown on the GaN layer to further reduce the strain. Preferably, the AlN inter-layer is in a range of approximately 1 nm to approximately 10 nm thick but for certain applications thicker or thinner films can be grown. Also, the AlN inter-layer can be grown using either a low or a high temperature process. A second layer of GaN is epitaxially grown on the AlN inter-layer. A second inter-layer of AlN is grown on the second GaN layer and this process is repeated n times or until the strain in the upper GaN or III-N layer has been reduced to an acceptable level. Basically, the strain formed during the growth of the GaN is controlled by insertion of the thin inter-layers of AlN, each of which allows the following layer of GaN to be under compressive stress due to the pseudomorphic growth at the interface. Repeating the process (i.e. the alternating growth of the GaN layers and the interlayers of AlN) n times can be used to further reduce or engineer strain in a final GaN or III-N layer.

Also as explained in a copending United States patent application entitled "AlN Cap Grown on GaN/REO/Silicon Substrate Structure", Ser. No. 13/772,169, filed on 20 Feb. 2013, and incorporated herein by reference, an AlN cap (not shown) can optionally be grown on the upper layer of the GaN/AlN interlayer structure to further reduce strain in an ultimate layer. Even with multiple Interlayers of AlN and GaN grown on REO stress compensating layer 11 there can be some strain when a III-N layer of material is grown on the upper surface. An AlN cap layer can provide a better match between the GaN/REO/silicon substrate structure and can substantially remove any strain that may remain between III material nitrides, especially any nitrides including aluminum. Thus, the AlN cap layer will facilitate the growth of III-N materials and especially III-N materials including aluminum. Also, in some applications an AlN cap layer can reduce the number of times that the alternating growth of GaN layers and interlayers of AlN need to be repeated in order to reduce the strain in the final III-N layer.

Figure 2:
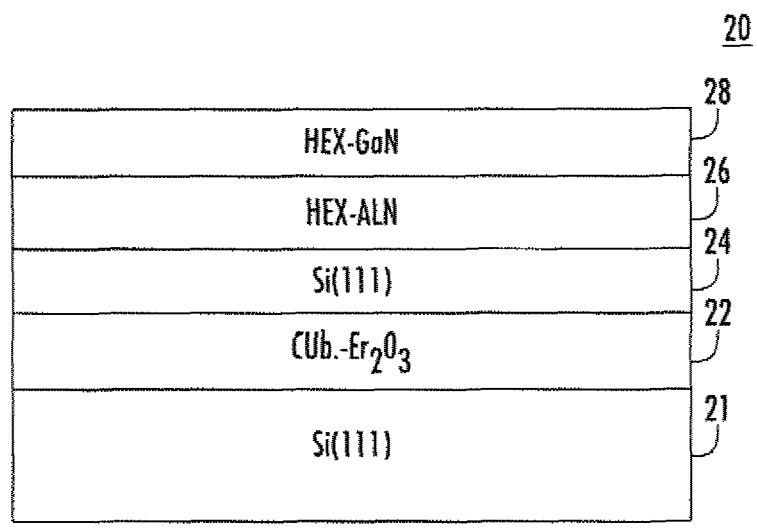
FIG. 2 is a simplified layer diagram illustrating a specific example of a REO and Si stress compensating template.

Referring additionally to FIG. 2, another example of a REO template 20 is illustrated. In this example a single crystal layer 22 of cubic REO material, such as erbium oxide (or any other cubic rare earth oxides with an atomic number larger than gadolinium), is epitaxially grown on silicon substrate 21. Silicon substrate 21 is similar to substrate 10 described above. Single crystal layer 22 of cubic REO material has a crystal lattice spacing approximately −3% (see explanation above) different than the double lattice spacing of silicon. A thin layer 24 of single crystal silicon is epitaxially grown on single crystal layer 22 and, because of the negative mismatch has a lattice spacing that is stretched to more closely match the spacing of single crystal layer 22, i.e. layer 24 of the epitaxial silicon has a negative spacing different than the spacing of substrate 21.

A thin layer 26 of AlN is epitaxially grown on layer 24 of epitaxial silicon. AlN layer 26 has a hexagonal crystal structure in which five lattice spacings are misfit from four standard silicon lattice spacings by −1.2%. While this is sufficient to allow lattice coincident epitaxy, layer 24 of epitaxial silicon further reduces this misfit (i.e. below −1.2%) so that better lattice matching is achieved with further reduction of dislocation density in AlN layer 26.

A layer 28 of GaN is epitaxially grown on AlN layer 26 which is illustrated as layer 12 in FIG. 1. GaN layer 28 has a hexagonal crystal structure which closely matches the hexagonal crystal structure of AlN. A thicker active layer of III-N material (layer 14 in FIG. 1) can then be epitaxially grown on layer 28. It should also be noted that any gallium containing layer cannot be grown on silicon because gallium etches silicon and cannot touch silicon. Thus, the example described also protects the silicon from the gallium.

With a relatively stress free upper layer 12 of GaN in place, a layer 14 of III-N semiconductor material, in this preferred example AlGaN, is epitaxially grown on layer 12. Layer 14 of III-N semiconductor material forms an active layer for semiconductor devices built on/in the surface thereof. Because III-N layer 14 is grown with very little stress due to the layers described above, it can be grown sufficiently thick to conveniently form electronic devices therein.

In a preferred method, a gate dielectric layer 16 is epitaxially grown on the upper surface of III-N layer 14. Gate dielectric layer 16 is not crystal lattice matched to the III-N material of layer 14 because the lattice constant of the rare earth oxide is larger than the III-N. However, the REO material is single crystal and is polymorphous which means the crystal structure is different than the crystal structure of bulk REO material. Bulk REO material normally has a cubic structure (the type of rare earth oxide used in the present case) while the crystal structure of the REO in gate dielectric layer 16 is monoclinic because it is grown on III-N layer 14 which has a hexagonal crystal structure.

Because gate dielectric layer 16 is epitaxially grown on the upper surface of III-N layer 14, the various layers can be grown in situ, that is without removing the structure from the growth chamber, which substantially simplifies the method. Further, there is a large advantage in using the same materials for buffer layer 11 and gate dielectric layer 16. This can be accomplished relatively easily when template 20 is used since it includes a single layer of REO material. Thus, the entire structure including template 11 and, layers 12, 14, and 16 can be grown on substrate 10 in one continuous operation. Layer 16 serves as a high k gate dielectric layer for a device formed thereon, such as a field effect transistor or the like. Also, because layer 16 is a single crystal material dangling bonds that could act as charge trap centers in any device are substantially avoided.

With gate dielectric layer 16 positioned on III-N active layer 14, a source and a drain can be formed in III-N active layer 14 by any well known method, such as implanting dopants. In a typical procedure gate dielectric layer 16 is grown and masked to define a channel in active layer 16 and the source/drain implants are automatically aligned. Source/drain contacts can then be formed in a typical metallization process and a gate stack 19 is formed on the upper surface of gate dielectric layer 16. While this description only illustrates a single Field Effect Transistor (FET) for a complete understanding, it will be understood that anything from discrete devices to complete circuits can be formed using the same methods.

Figure 3:
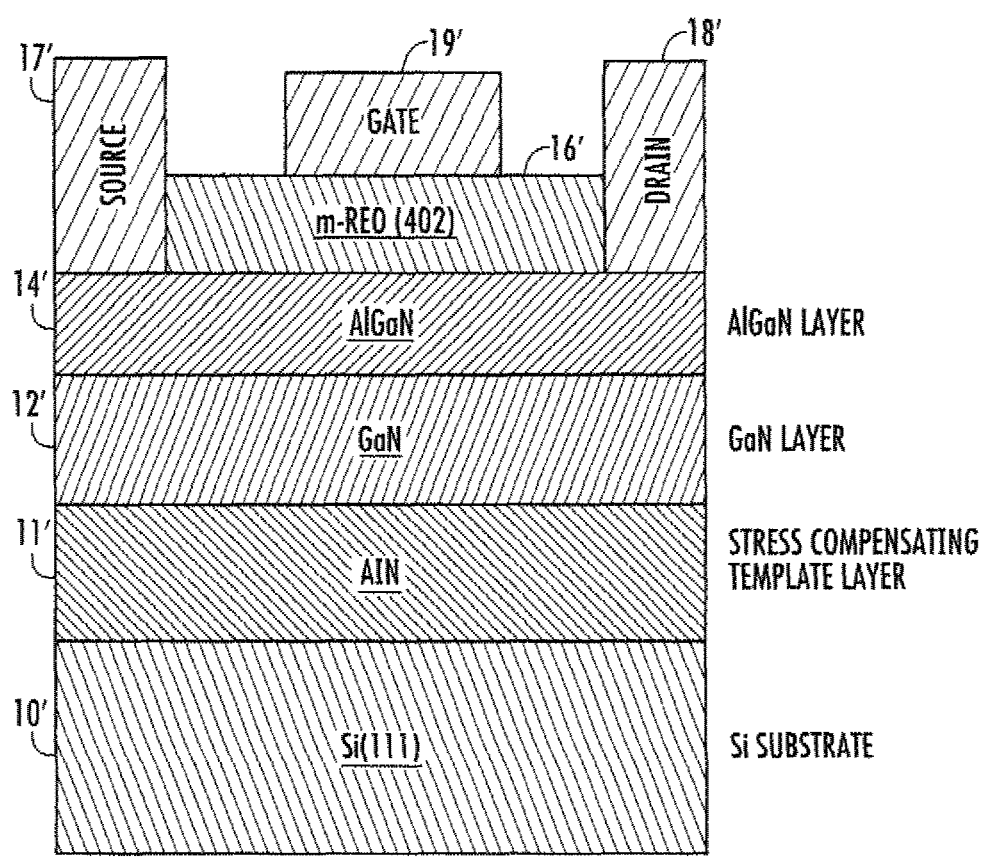
FIG. 3 is a simplified layer diagram illustrating a REO gate dielectric on a III-N device with a stress compensating AlN template, in accordance with the present invention.

Turning now to FIG. 3, an example is illustrated of a III-N device formed on another stress compensating template, in accordance with the present invention. In this example components that are similar to components in FIG. 1 are designated with a similar number having a prime (') added to indicate the different example. In this example, the stress compensating template including cubic rare earth oxide (layer 11) is replaced with an AlN stress compensating layer 11'. Layer 11' includes one or more layers including AlN and the layers can be stepped or graded in a well known process and may include other materials to reduce the misfit between AlN and Si. Generally, AlN is grown with a low temperature method especially prevalent when using MOCVD process, which results in the AlN lattice and the silicon lattice being misfit by approximately −1.2% however for purposes of this disclosure the term "substantially crystal lattice matched" is defined to include a mismatch of −1.2% or less.

Thus, new and improved methods for the growth of III-N material and devices on a silicon substrate are disclosed. The new and improved methods for the III-N material include the growth of a stress compensating template grown epitaxially on the silicon substrate. A high k rare earth gate dielectric layer is grown epitaxially on the substantially stress free III-N layer in what can be a continuous or in situ operation. The rare earth gate dielectric layer has sufficient dielectric constant and a proper bandwidth offset for the formation of high performance electronic components, such as FETs and the like, in the III-N layer.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. Rare earth oxide gate dielectric on III-N material grown on a silicon substrate comprising:
   a single crystal silicon substrate;
   a single crystal stress compensating template positioned on the silicon substrate, the stress compensating template being substantially crystal lattice matched to the surface of the silicon substrate;
   a GaN structure positioned on the surface of the stress compensating template, the GaN structure being substantially crystal lattice matched to the single crystal stress compensating template;
   an active layer of single crystal III-N material grown on the GaN structure, the single crystal III-N material being substantially crystal lattice matched to the GaN structure; and
   a single crystal rare earth oxide dielectric layer grown on the active layer of III-N material.

2. The rare earth oxide gate dielectric on III-N material grown on a silicon substrate as claimed in claim 1 wherein the stress compensating template includes one or more layers of aluminum nitride and/or aluminum oxynitride.

3. The rare earth oxide gate dielectric on III-N material grown on a silicon substrate as claimed in claim 1 wherein the stress compensating template includes one or more layers of single crystal rare earth oxide.

4. The rare earth oxide gate dielectric on III-N material grown on a silicon substrate as claimed in claim 3 wherein the stress compensating template includes a composition including multiple rare earth oxides one of graded to bridge the multiple rare earth oxides or stepped to have an abrupt change in the rare earth oxides.

5. The rare earth oxide gate dielectric on III-N material grown on a silicon substrate as claimed in claim 4 wherein the composition including multiple rare earth oxides includes a first rare earth oxide adjacent the silicon substrate having a crystal lattice spacing substantially matching a double lattice spacing of silicon and a second rare earth oxide adjacent the GaN structure having a crystal lattice spacing substantially matching a crystal lattice spacing of the GaN structure.

6. The rare earth oxide gate dielectric on III-N material grown on a silicon substrate as claimed in claim 1 wherein the single crystal stress compensating template includes a layer of cubic rare earth oxide grown on the silicon substrate, a layer of epitaxial silicon grown on the cubic REO layer, and a layer of AlN grown on the epitaxial silicon layer.

7. The rare earth oxide gate dielectric on III-N material grown on a silicon substrate as claimed in claim 6 wherein the cubic rare earth oxide layer of the single crystal stress compensating template includes the same rare earth metal as the single crystal rare earth oxide dielectric layer.

8. The rare earth oxide gate dielectric on III-N material grown on a silicon substrate as claimed in claim 1 wherein the single crystal rare earth oxide dielectric layer forms a gate dielectric layer and is patterned to define a device channel in the active layer of single crystal III-N material.

9. The rare earth oxide gate dielectric on III-N material grown on a silicon substrate as claimed in claim 8 further including a source and a drain formed in the active layer of single crystal III-N material on opposite sides of the single crystal rare earth dielectric layer and further including source and drain contacts formed on the source and drain and a gate stack formed on the single crystal rare earth dielectric layer.

10. The rare earth oxide gate dielectric on III-N material grown on a silicon substrate as claimed in claim 1 wherein the active layer of single crystal III-N material includes AlGaN.

11. A method of growing rare earth oxide gate dielectric on III-N material grown on a silicon substrate comprising the steps of:
providing a single crystal silicon substrate;
growing or depositing a single crystal stress compensating template on the silicon substrate, the stress compensating template being substantially crystal lattice matched to the surface of the silicon substrate;
growing or depositing a single crystal GaN structure on the surface of the stress compensating template, the GaN structure being substantially crystal lattice matched to the single crystal stress compensating template;
growing or depositing an active layer of single crystal III-N material on the GaN structure, the single crystal III-N material being substantially crystal lattice matched to the GaN structure; and
growing or depositing a single crystal rare earth oxide dielectric layer on the active layer of III-N material.

12. The method as claimed in claim 11 wherein the steps of growing or depositing a single crystal stress compensating template, growing or depositing a GaN structure, growing or depositing an active layer of single crystal III-N material, and growing or depositing a single crystal rare earth oxide dielectric layer are all performed in situ or in a continuous operation.

13. The method as claimed in claim 11 wherein the step of growing or depositing the active layer of single crystal III-N material includes growing or depositing a layer of AlGaN.

14. The method of claim 11 wherein the step of growing or depositing a single crystal stress compensating template includes epitaxially growing one or more layers of single crystal rare earth oxide.

15. The method as claimed in claim 14 wherein the step of growing one or more layers of single crystal rare earth oxide includes a step of forming a composition including multiple rare earth oxides one of graded to bridge the multiple rare earth oxides or stepped to have an abrupt change in the rare earth oxides.

16. The method as claimed in claim 15 wherein the step of forming the composition includes epitaxially growing a first rare earth oxide adjacent the silicon substrate having a crystal lattice spacing substantially matching a double lattice spacing of silicon and epitaxially growing a second rare earth oxide adjacent the GaN structure having a crystal lattice spacing substantially matching a crystal lattice spacing of the GaN structure.

17. The method as claimed in claim 14 wherein the step of growing or depositing one or more layers of the single crystal rare earth oxide includes a step of growing or depositing a composition including multiple rare earth oxides.

18. The method as claimed in claim 11 wherein the step of growing or depositing the single crystal stress compensating template includes growing or depositing a layer of cubic rare earth oxide on the silicon substrate, growing or depositing a layer of epitaxial silicon on the cubic REO layer, and growing or depositing a layer of AlN on the epitaxial silicon layer.

19. The method as claimed in claim 18 wherein the step of growing or depositing the cubic rare earth oxide layer of the single crystal stress compensating template and the step of growing or depositing the single crystal rare earth oxide dielectric layer include growing or depositing the same rare earth metal oxide.

20. The method as claimed in claim 11 further including the steps of forming the single crystal rare earth oxide dielectric layer into a gate dielectric layer and patterning the gate dielectric layer to define a device channel in the active layer of single crystal III-N material.

21. The method as claimed in claim 20 further including a step of forming a source and a drain in the active layer of single crystal III-N material on opposite sides of the single crystal gate dielectric layer and further including forming source and drain contacts on the source and drain and forming a gate stack on the single crystal gate dielectric layer.

* * * * *